US011469078B2

(12) United States Patent
Tom et al.

(10) Patent No.: US 11,469,078 B2
(45) Date of Patent: Oct. 11, 2022

(54) OPTICAL SYSTEM FOR MONITORING PLASMA REACTIONS AND REACTORS

(71) Applicant: ReCarbon, Inc., Santa Clara, CA (US)

(72) Inventors: Curtis Peter Tom, San Mateo, CA (US); Fei Xie, Sunnyvale, CA (US); Wei Li, San Jose, CA (US); Stefan Andrew McClelland, San Jose, CA (US)

(73) Assignee: ReCarbon, Inc., Santa Clara, CA (US)

( * ) Notice: Subject to any disclaimer, the term of this patent is extended or adjusted under 35 U.S.C. 154(b) by 140 days.

(21) Appl. No.: 16/820,669

(22) Filed: Mar. 16, 2020

(65) Prior Publication Data

US 2020/0312639 A1 Oct. 1, 2020

Related U.S. Application Data

(60) Provisional application No. 62/823,514, filed on Mar. 25, 2019, provisional application No. 62/823,505, (Continued)

(51) Int. Cl.
*H01J 37/32* (2006.01)
*H05H 1/46* (2006.01)
(Continued)

(52) U.S. Cl.
CPC ......... *H01J 37/32229* (2013.01); *B01J 19/12* (2013.01); *C23C 16/511* (2013.01); (Continued)

(58) Field of Classification Search
CPC ........... H01J 37/32229; H01J 37/32449; H01J 37/32623; H01J 37/32844; (Continued)

(56) References Cited

U.S. PATENT DOCUMENTS 4,707,147 A * 11/1987 Aoki ................... G01J 5/0018
374/161
5,671,045 A * 9/1997 Woskov ................ G01N 21/73
333/99 PL
(Continued)

FOREIGN PATENT DOCUMENTS

EP 961527 A1 * 12/1999 ............... H05H 1/34
KR 10-2008-0099695 A 11/2008
WO WO-2006043420 A1 * 4/2006 ............... H05H 1/24

OTHER PUBLICATIONS

First Examination Report in Indian Application No. 202117048267 dated Mar. 11, 2022.

*Primary Examiner* — David P Porta
*Assistant Examiner* — Jeremy S Valentiner
(74) *Attorney, Agent, or Firm* — Buchalter; Jason W. Croft

(57) ABSTRACT

The present invention provides a plasma generating system that includes: a waveguide; a plasma cavity coupled to the waveguide and configured to generate a plasma therewithin by use of microwave energy; a hollow cylinder protruding from a wall of the waveguide and having a bottom cap that has an aperture; a detection unit for receiving the light emitted by the plasma through the aperture and configured to measure intensities of the light in an ultraviolet (UV) range and an infrared (IR) range; and a controller for controlling the detection unit.

20 Claims, 6 Drawing Sheets

Related U.S. Application Data filed on Mar. 25, 2019, provisional application No. 62/823,492, filed on Mar. 25, 2019, provisional application No. 62/823,436, filed on Mar. 25, 2019, provisional application No. 62/823,508, filed on Mar. 25, 2019, provisional application No. 62/823,517, filed on Mar. 25, 2019, provisional application No. 62/823,484, filed on Mar. 25, 2019.

(51) Int. Cl.
| | | |
|---|---|---|
| *G01J 1/04* | (2006.01) | |
| *B01J 19/12* | (2006.01) | |
| *G01J 5/00* | (2022.01) | |
| *C23C 16/511* | (2006.01) | |
| *G01J 1/42* | (2006.01) | |

(52) U.S. Cl.
CPC ............ *G01J 1/0425* (2013.01); *G01J 1/0492* (2013.01); *G01J 1/429* (2013.01); *G01J 1/4228* (2013.01); *G01J 5/0018* (2013.01); *H01J 37/32449* (2013.01); *H01J 37/32623* (2013.01); *H01J 37/32844* (2013.01); *H01J 37/32972* (2013.01); *H05H 1/46* (2013.01); *F01N 2240/28* (2013.01); *H01J 37/32192* (2013.01); *H01J 37/32513* (2013.01); *H01J 2237/1502* (2013.01); *H05H 1/4622* (2021.05)

(58) Field of Classification Search
CPC ........... H01J 37/32972; H01J 37/32192; H01J 37/32513; H01J 2237/1502; B01J 19/12; C23C 16/511; G01J 1/0425; G01J 1/0492; G01J 1/4228; G01J 1/429; G01J 5/0018; H05H 1/46; H05H 1/4622; F01N 2240/28

See application file for complete search history.

(56) References Cited

U.S. PATENT DOCUMENTS

| | | | | |
|---|---|---|---|---|
| 5,897,378 | A | * | 4/1999 | Eriguchi ............. C23C 16/4405 118/712 |
| 2002/0139925 | A1 | * | 10/2002 | Mitrovic ................ G01N 21/68 250/226 |
| 2004/0135517 | A1 | * | 7/2004 | Schriever ............... H05G 2/003 315/111.21 |
| 2006/0021633 | A1 | * | 2/2006 | Harvey ................. B08B 7/0035 134/1.1 |
| 2007/0095789 | A1 | * | 5/2007 | Davis ............... H01J 37/32935 216/59 |
| 2010/0247403 | A1 | * | 9/2010 | Hancock ................... A61L 2/14 422/186.29 |
| 2014/0159572 | A1 | * | 6/2014 | Risby ............... H01J 37/32357 315/39.51 |

* cited by examiner

OPTICAL SYSTEM FOR MONITORING PLASMA REACTIONS AND REACTORS

CROSS-REFERENCE TO PRIOR APPLICATIONS

This application claims priority of U.S. Patent Application Nos. 62/823,436; 62/823,492; 62/823,505; 62/823,508; 62/823,514; 62/823,517; and 62/823,484, which are hereby incorporated by reference in their entirety.

BACKGROUND OF THE INVENTION

1. Field of the Invention

The present invention relates to plasma generators, and more particularly to devices for monitoring plasma in plasma reactors.

2. Discussion of the Related Art

In recent years, microwave technology has been applied to generate various types of plasma. Typically, a microwave discharge, which is used as a plasma source, is achieved by coupling microwave energy into a discharge chamber containing gas to be processed. In the conventional microwave-based plasma systems that are used for hydrocarbon gas reformation, variations in the feed stock composition can cause plasma instability, undesirable depositions on the reactor wall and other surfaces, and other phenomena that degrade system performance or damage components in the systems. To prevent damage to the plasma systems under fault conditions and to maximize throughput and efficiency of the systems, the plasma health and operational conditions need to be continuously monitored and assessed during the operation of the systems.

As such, there is a need for a device that can continuously monitor and assess the plasma health and operational conditions of the plasma systems in a reliable manner.

SUMMARY OF THE INVENTION

According to one aspect of the present invention, a plasma generating system includes: a waveguide; a plasma cavity coupled to the waveguide and configured to generate a plasma therewithin by use of microwave energy; a hollow cylinder protruding from the wall of the waveguide and having a bottom cap that has an aperture; a detection unit for receiving the light emitted by the plasma through the aperture and configured to measure intensities of the light in an ultraviolet (UV) range and an infrared (IR) range; and a controller for controlling the detection unit.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components.

Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. The terms "include," "including," "comprise," and "comprising" shall be understood to be open terms and any lists the follow are examples and not meant to be limited to the listed items.

Figure 1:
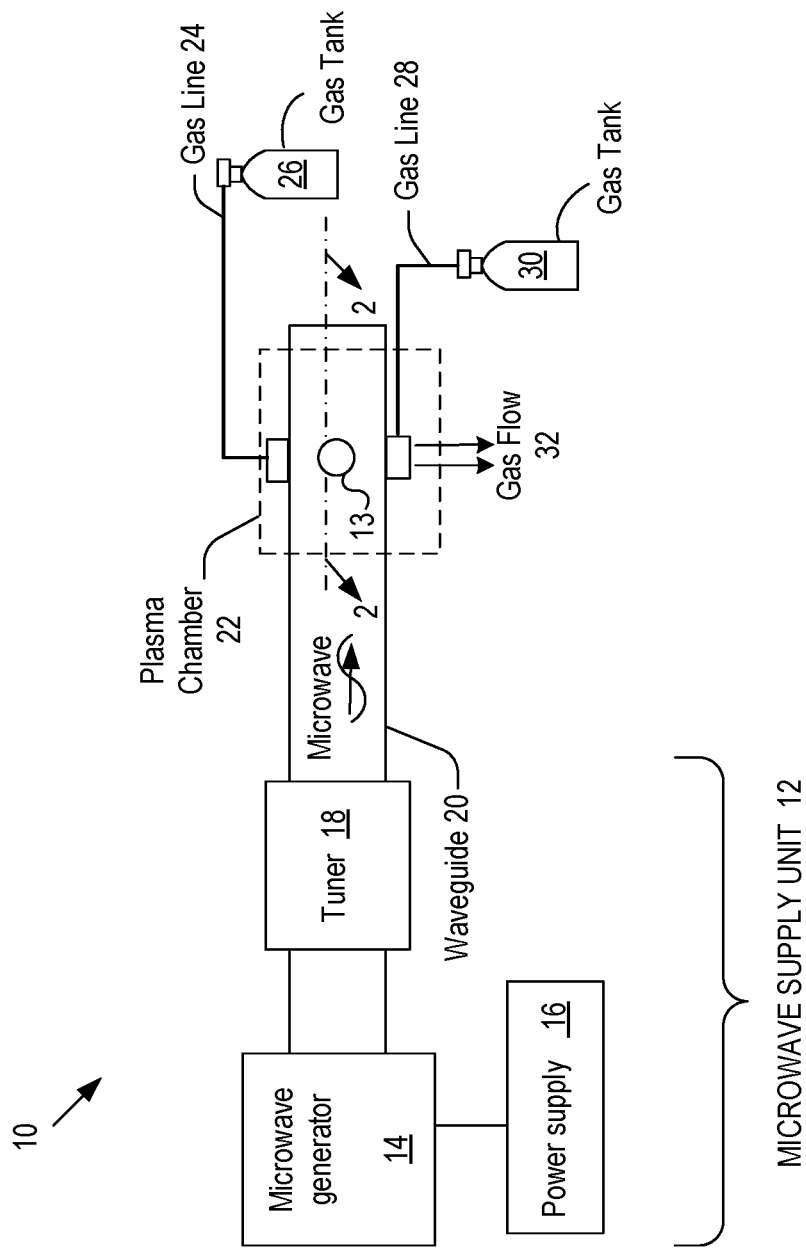
FIG. 1 ("FIG. 1") shows a schematic diagram of a plasma generating system according to embodiments of the present disclosure.

FIG. 1 ("FIG. 1") shows a schematic diagram of a plasma generating system 10 according to embodiments of the present disclosure. As depicted, the plasma generating system 10 includes: a microwave cavity/waveguide 20 having a shape of a hollow tube; a plasma chamber 22 connected to the waveguide 20; and a microwave supply unit 12 connected to the waveguide 20 and operative to provide microwave energy to the plasma chamber 22 via a microwave waveguide 20. In embodiments, the plasma chamber 22 receives the microwave energy and processes gas by use of the received microwave energy. In embodiments, a gas tank 26 provides gas to the plasma chamber 22 via a gas line 24, and a gas tank 30 provides gas to the plasma chamber 22 via a gas line 28.

The microwave supply unit 12 provides microwave energy to the plasma chamber 22 and includes: a microwave generator 14 for generating microwaves; a power supply 16 for supplying power to the microwave generator 14; and a tuner 18 for reducing the microwave energy reflected from the plasma chamber 22 and travelling toward the microwave generator 14. In embodiments, the microwave supply unit 12 may include other components, such as an isolator having a dummy load for dissipating reflected microwave energy that propagates toward the microwave generator 14 and a circulator for directing the reflected microwave energy to the dummy load and a sliding short circuit disposed at the end of the waveguide 20.

Figure 2:
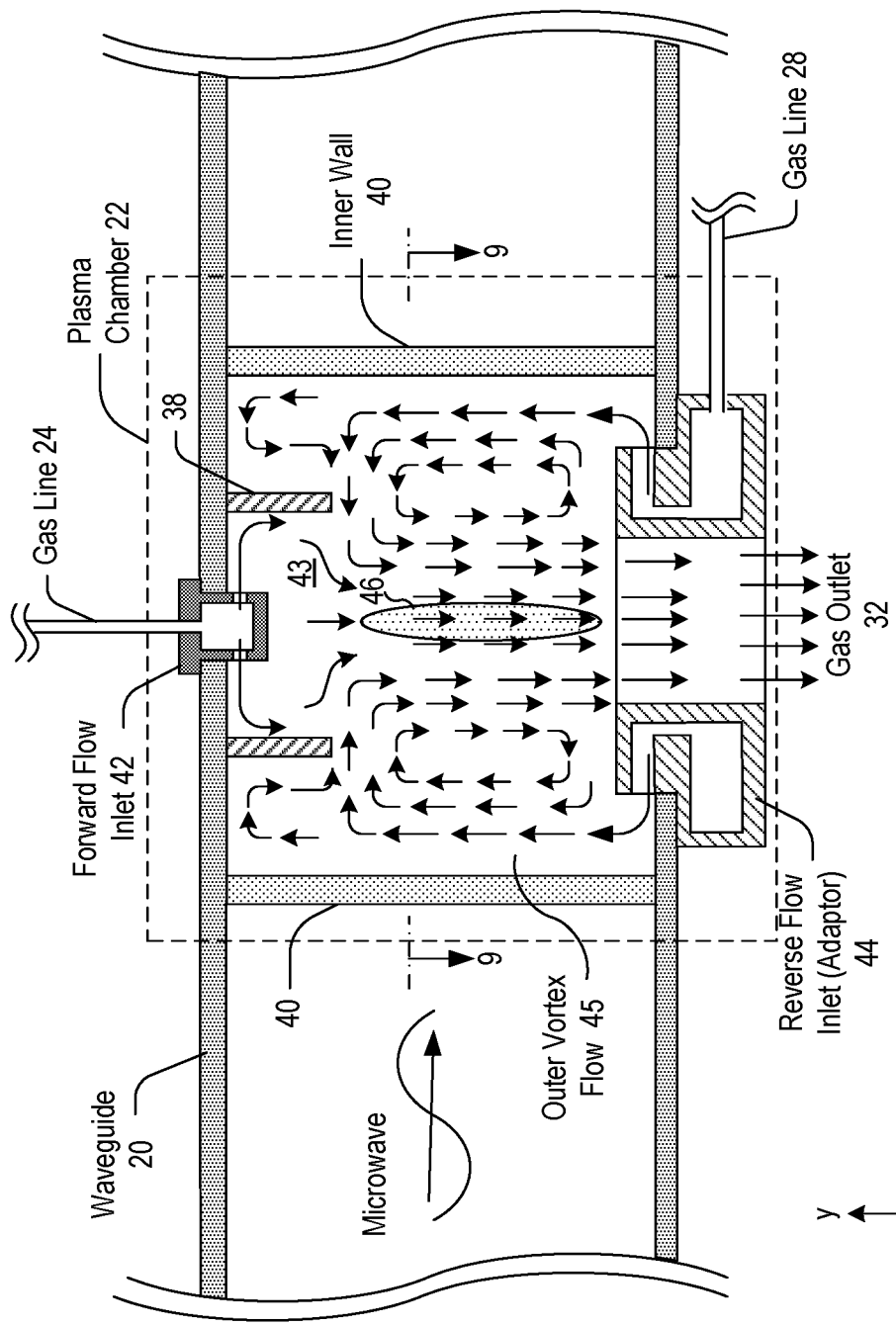
FIG. 2 shows a cross sectional view of a plasma chamber in FIG. 1, taken along the line 2-2, according to embodiments of the present disclosure.

FIG. 2 shows a cross sectional view of a plasma chamber 22 in FIG. 1, taken along the line 2-2, according to embodiments of the present disclosure. As depicted, the plasma chamber 22 includes: an inner wall(s) 40; a plasma stabilizer 38; a forward flow inlet (which is also referred to as "vortex flow generator") 42 connected to the gas line 24 and configured to introduce the forward flow into the plasma chamber; and a reverse flow inlet (which is also referred to as "adaptor") 44 connected to the gas line 28 and configured to introduce the reverse flow into the plasma chamber. Here, the term plasma cavity refers to the enclosed space that is surrounded by the inner wall 40, waveguide 20, forward flow inlet 42 and reverse flow inlet (adaptor) 44, where the reverse flow gas and forward flows are processed/reformed by plasma plume (or shortly, plasma) 46 in the plasma cavity using the microwave energy transmitted via the waveguide 20.

In embodiments, the inner wall 40 is formed of a material that is transparent to the microwave energy, such as quartz or ceramic. In embodiments, the inner wall 40 is formed of any other suitable dielectric material that is desirable for uniform flow, thermal resistance, chemical resistance, and electromagnetic transparency. Also, as discussed below, in embodiments, the inner wall 40 is formed of material that is transparent to UV and IR light. In embodiments, the inner wall 40 has preferably, but not limited to, a shape of hollow circular cylinder.

Figure 3:
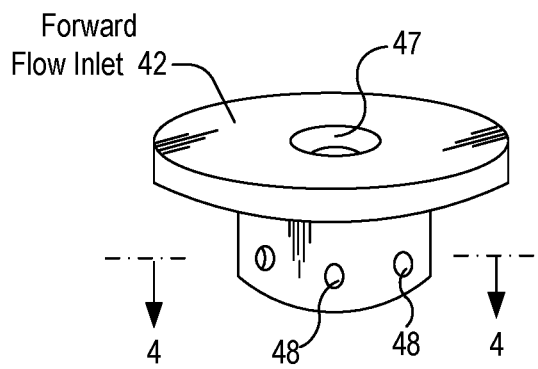
FIG. 3 shows a perspective view of a forward flow inlet according to embodiments of the present disclosure.
Figure 4:
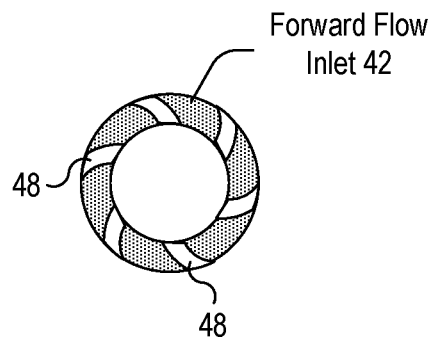
FIG. 4 shows a cross sectional view of the forward flow inlet in FIG. 3, taken along the line 4-4, according to embodiments of the present disclosure.

FIG. 3 shows a perspective view of the forward flow inlet 42 according to embodiments of the present disclosure. FIG. 4 shows a cross sectional view of the forward flow inlet 42, taken along the line 4-4, according to embodiments of the present disclosure. As depicted, the forward flow inlet 42 has a hole/adaptor 47 for coupling to the gas line 24 and one or more gas passageways 48 that are formed in the wall thereof. In embodiments, the exits of the gas passageways 48 are located inside the plasma stabilizer 38 so that the plasma stabilizer 38 forms an inner vortex flow 43 using the flow exiting the gas passageways 48. In embodiments, the inner diameter of the plasma stabilizer 38 may be varied to adjust the outer diameter of the inner vortex flow 43. In embodiments, as discussed above, the plasma stabilizer 38 may have a shape of hollow circular cylinder and disposed concentrically to the forward flow inlet 42.

In embodiments, each gas passageway 48 is arranged to impart spiral motion to the forward flow as the forward flow enters the plasma cavity via the gas passageway 48. In embodiments, each gas passageway 48 may be curved to enhance the vorticity of the forward flow. In embodiments, the forward flow inlet 42 is formed of any suitable material, such as metal or dielectric material, so that the inlet is electrically isolated from the waveguide 20 and withstand the heat energy from the plasma 46.

Figure 7:
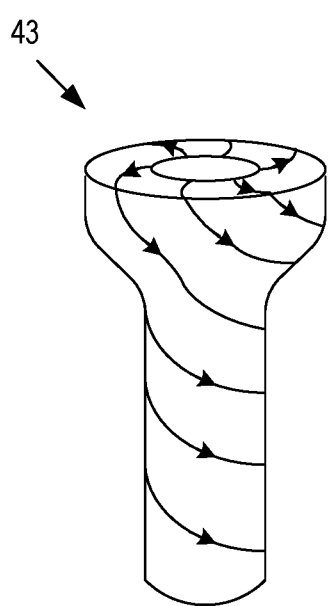
FIG. 7 shows a perspective view of an inner vortex flow according to embodiments of the present disclosure.

In embodiments, the plasma stabilizer 38 is formed of material that is transparent to the microwave energy, and preferably formed of the same material as the inner wall 40. In embodiments, the plasma stabilizer 38 is attached to the waveguide 20, protruding into the plasma cavity, where the axial direction of the plasma stabilizer 38 is parallel to the y-axis. In embodiments, as discussed above, the inner wall 40 may have a shape of a hollow circular cylinder and the plasma stabilizer 38 may be installed concentrically to the inner wall 40. In embodiments, the forward flow inside the plasma stabilizer 38 forms the inner vortex flow 43 and proceeds toward the other end of the waveguide 20, more specifically toward the gas outlet 32. FIG. 7 shows a perspective view of the inner vortex flow 43 according to embodiments of the present disclosure. As depicted, the forward flow (or equivalently, inner vortex flow) travels the length of the inner wall 40 in a helical motion until the inner vortex flow exits the gas outlet 32.

In embodiments, upon ignition of the plasma 46, the plasma 46 is sustained by the microwave energy transmitted by the microwave generator 14. In embodiments, the plasma 46 is located within the inner vortex flow 43 so that the gas particles of the inner vortex flow 43 pass through the plasma 46. In embodiments, the plasma stabilizer 38 determines the outer diameter of the inner vortex flow 43, preventing the forward flow from bypassing the plasma 46 before exiting the plasma cavity through the gas outlet 32. In embodiments, the plasma stabilizer 38 aids in keeping the plasma 46 stable by separating the inner vortex flow 43 from the outer vortex flow 45.

Figure 5:
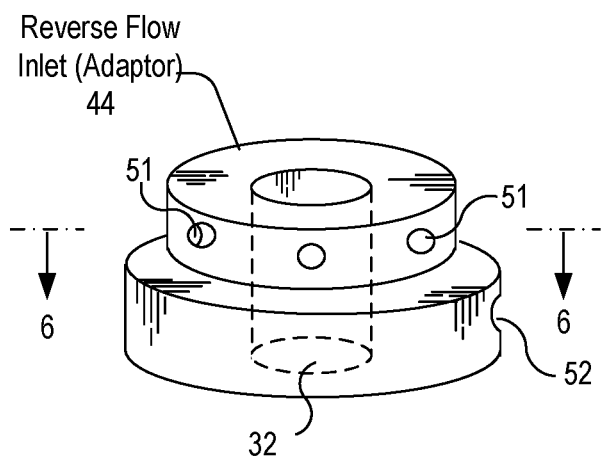
FIG. 5 shows a perspective view of an adaptor according to embodiments of the present disclosure.
Figure 6:
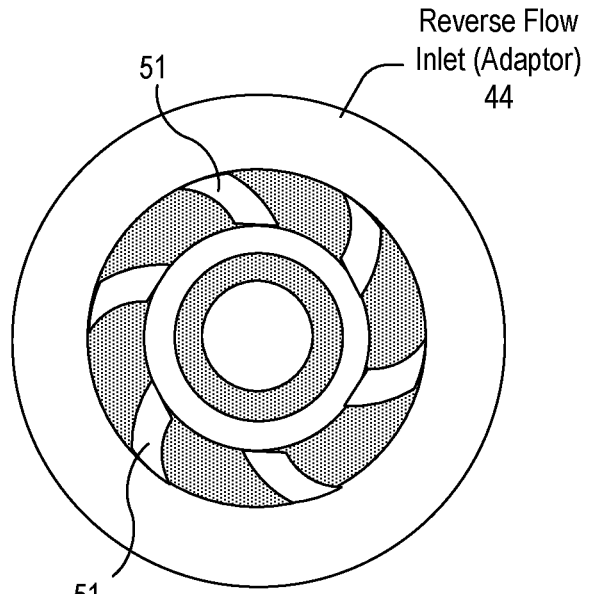
FIG. 6 shows a cross sectional view of the adaptor in FIG. 5, taken along the line 6-6, according to embodiments of the present disclosure.

FIG. 5 shows a perspective view of the reverse flow inlet (adaptor) 44 according to embodiments of the present disclosure. FIG. 6 shows a cross sectional view of the reverse flow inlet (adaptor) 44, taken along the line 6-6, according to embodiments of the present disclosure. As depicted, the reverse flow inlet (adaptor) 44 has a hole/adaptor 52 for coupling to the gas line 28, a hole to form the gas outlet 32, and one or more gas passageways 51 that are formed in the wall thereof. In embodiments, each gas passageway 51 is arranged to impart spiral motion to the reverse flow as the reverse flow enters the plasma cavity via the gas passageway 51. In embodiments, each gas passageway 51 may be curved to enhance the vorticity of the reverse flow. In embodiments, the reverse flow inlet (adaptor) 44 is formed of preferably, but not limited to Ni alloy, such as Inconel or Hastelloy.

Figure 8:
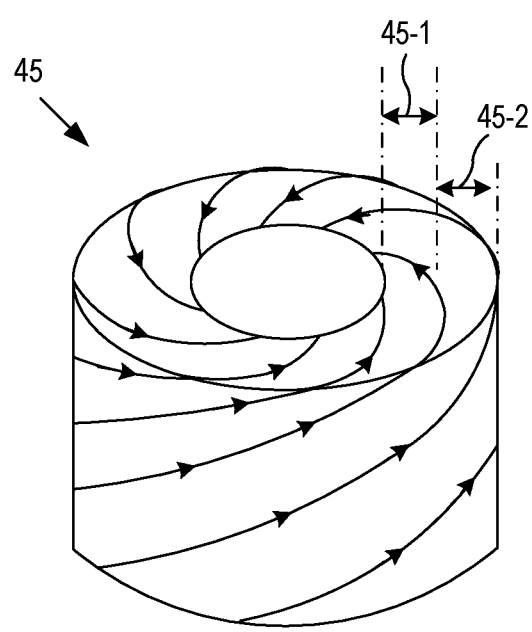
FIG. 8 shows a perspective view of an outer vortex flow according to embodiments of the present disclosure.

In embodiments, the reverse flow exiting the reverse flow inlet (adaptor) 44 travels toward to the inner wall 40 and then proceeds upwardly (y-axis direction) toward the other end of the waveguide 20 along the inner wall 40 in a helical motion. Subsequently, the reverse flow reverses the flow direction to proceed downwardly and form an outer vortex flow 45. In embodiments, the rotational axis of the outer vortex flow 45 is substantially parallel to the y-axis. FIG. 8 shows a perspective view of the outer vortex flow 45 according to embodiments of the present disclosure. As depicted, the outer vortex flow 45 has a hollow cylinder shape and has two flow regions: inner downward flow region 45-1 and an outer upward flow region 45-2. In embodiments, the inner vortex flow 43 is disposed in the middle hollow portion of the outer vortex flow 45 and surrounded by inner downward flow region 45-1. It is noted that the gas from the forward flow inlet 42 is mixed with the flow from the reverse flow inlet (adaptor) 44 to form the inner vortex flow 43.

In embodiments, the outer vortex flow 45 surrounds the inner vortex flow 43, to thereby shield the inner wall 40 from the plasma 46. In embodiments, the reverse flow exiting the reverse flow inlet (adaptor) 44 may have the ambient temperature and take heat energy from the inner wall 40 as the outer vortex flow 45 travels upwardly along the inner wall 40 in the helical motion.

In embodiments, as discussed above, the inner diameter of the plasma stabilizer 38 determines the radial dimension of the inner vortex flow 43. As such, in embodiments, the inner diameter of the plasma stabilizer 38 may be adjusted so that the outer vortex flow 45 surrounds the inner vortex flow 43 and maintain the flow regime of the inner vortex flow 43 in a stable manner to thereby stabilize the plasma and yield improved throughput and efficiency In embodiments, the plasma 46 is used to reform the inlet gas to the desired product gas, where the inlet gas is introduced into the plasma cavity by the forward flow inlet 42 and reverse flow inlet (adaptor) 44. In embodiments, the gas composition of the inner vortex flow exiting the forward flow inlet 42 includes $CO_2$, $CH_4$ and $O_2$, and the gas exiting the gas outlet 32 includes CO and $H_2$ as well as a non-reacted portion of forward flow gas. In embodiments, the preferred distribution for the forward flow is 5%-95% by mass of the total flow into the plasma chamber 22. In embodiments, the reverse flow may have the same gas composition of the forward flow. In alternative embodiments, the forward flow may have different gas composition from the reverse flow. Also, the gas composition of the forward flow (and/or reverse flow) may be changed during operation. For instance, the forward flow may include a slug of argon to aid ignition of the plasma 46. In embodiments, the gas compositions and flow rates of the forward and reverse flows may be adjusted to enhance the plasma stability and efficiency of the chemical reaction in the plasma chamber 22.

It is noted that the plasma chamber 22 may have different components and arrangement of the components. For instance, the plasma chamber 22 may not include the forward flow inlet 42, i.e., the waveguide 20 does not have any hole for receiving the forward flow inlet. In another example, the plasma stabilizer 38 may be mounted on the reverse flow inlet (adaptor) 44. The description of various embodiments of the plasma chamber 22 can be found in a copending U.S. patent application Ser. No. 16/752,689, entitled "Plasma reactor for processing gas," filed on Jan. 26, 2020, which is hereby incorporated by reference in its entirety.

As discussed above, the gas compositions and flow rates of the forward and reverse flows may affect the plasma stability and efficiency of the chemical reaction in the plasma chamber 22. In embodiments, the plasma 46 emits a broad spectrum of light that can be an indicator of proper operation of the system 10 and therefore can be used to monitor the plasma health/stability and plasma-based process, such as gas dissociation, among others, as an example. Also, in embodiments, depending on the input gas composition, operating pressure, and power input (which refers to the energy absorbed by the gases), the light emitted by the plasma 46 has a unique characteristic "signature" within the electromagnetic spectrum as well as in the intensity of light output and stability (flickering or movement of the plasma plume). For instance, when the input gas includes $CO_2$, $CH_4$ and $O_2$, properly operating plasma 46 may have a very strong emission in the range of 200 nm-500 nm. Also, in cases where there is carbon deposition on the inner wall 40, emission in the range of 635 nm-700 nm is present in the spectrum. In another example, at low power inputs, the emission intensity in the range of 200 nm-500 nm become less bright. In yet another example, when the reactor gas pressure in the plasma chamber 22 is low or inconsistent, the plasma 46 may flicker or fluctuate (like a candle flame disturbed by wind) from the center position while a stable plasma plume is very narrow beam and located at the center of the inner vortex 43.

Figure 9:
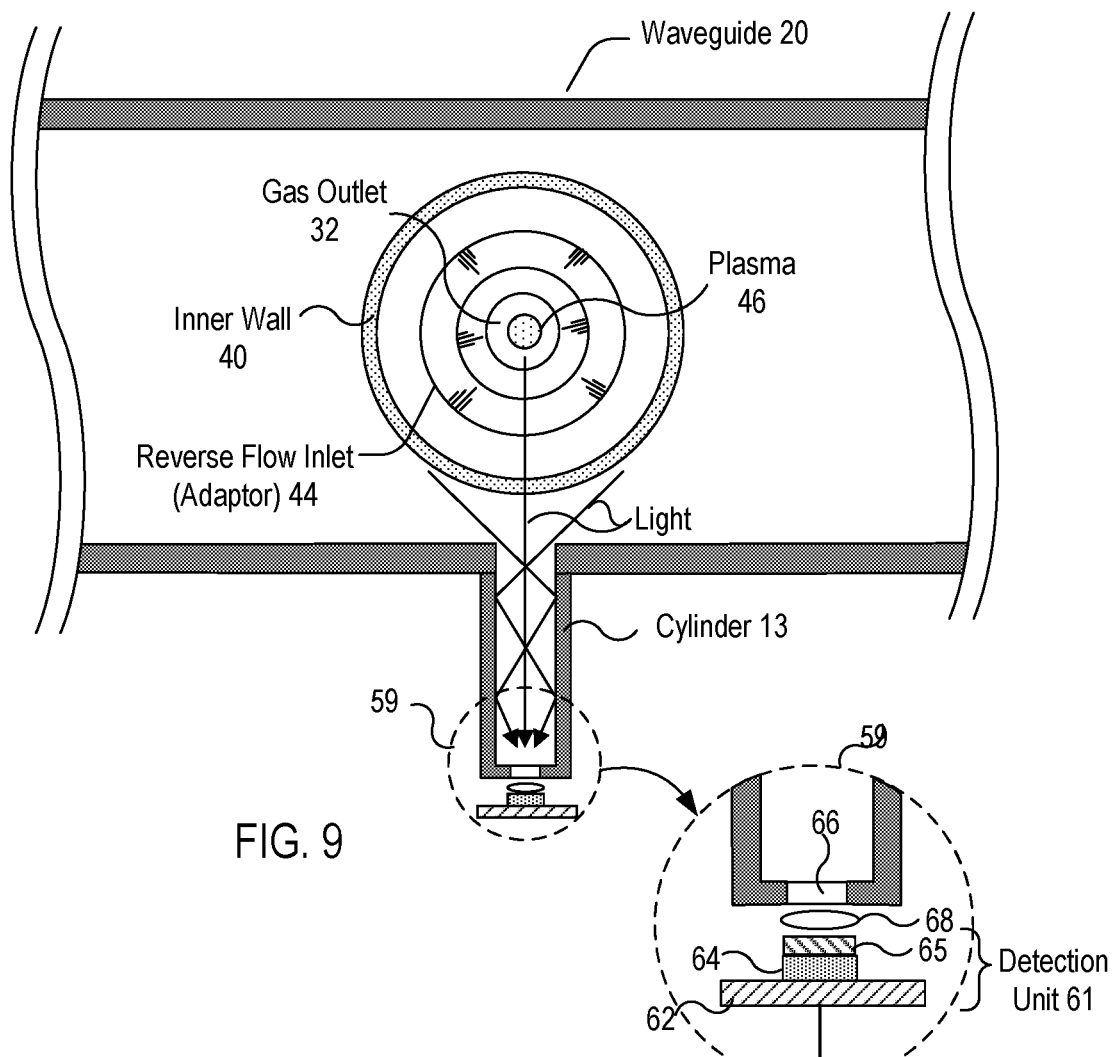
FIG. 9 shows a cross sectional view of the plasma chamber in FIG. 2, taken along the line 9-9, according to embodiments of the present disclosure.

FIG. 9 shows a cross sectional view of the plasma chamber 22 in FIG. 2, taken along the line 9-9, according to embodiments of the present disclosure. In FIG. 9, the inset diagram 59 shows the enlarged view of the optical arrangement near a detection unit 61. As depicted, the optical measurement system includes: a hollow cylinder 13 protruding from a side wall of the waveguide 20 with a bottom cap; an aperture/opening 66 formed in the bottom cap; and the detection unit 61 for detecting the light that passed through the aperture 66. In embodiments, the dimension of the aperture is small enough to meet safety requirements with respect to electromagnetic radiation leakage therethrough but large enough to allow the detection unit 61 to receive enough light for monitoring the plasma stability and operational conditions of the system 10. For instance, the aperture is a circular hole having a diameter of 0.1-4 mm.

In embodiments, the light emission from the plasma 46 travels through the inner wall 40 to reach the detection unit 61. As such, the inner wall 40 is formed of material that is transparent to the UV and IR light. In alternative embodiments, the aperture 66 is replaced by a window that is formed of material transparent to the UV and IR light.

In embodiments, the light emission from the plasma 46 and the light reflected from various components of the plasma chamber travel through the hollow cylinder 13 and exit the cylinder through the aperture 66. In embodiments, the detection unit 61 continuously monitors the emission during the startup (ignition) phase as well as the operation (reforming) phase. In embodiments, the detection unit 61 detects the emissions in the ultraviolet (UV) range, such as UVA, UVB and UVC, as well as in the near and mid infrared (IR) ranges. For instance, the UV range refers to 10 nm-400 nm, and the near and mid IR range refers to 750 nm-950 nm. In embodiments, the average intensity of two or more UV emissions (UVA, UVB and UVC) measured during the operation phase is indicative of the quality of the input gases (i.e., the gases introduced by the adaptor 44 and the forward flow inlet 42) and resulting plasma stability. In embodiments, the maximum and minimum intensities of one or more UV emissions (UVA, UVB and UVC) measured during the operation phase is also indicative of the quality of the input gases and resulting plasma stability.

In embodiments, the light emission from the plasma 46 travels through the inner wall 40, and thus, the intensity of near and/or mid IR emission(s) during the startup phase prior to formation of the plasma 46 is symptomatic of depositions (i.e., carbon) on the inner wall 40. As such, in embodiments, the combination of both UV and IR emissions of varying amplitudes during the operation phase are characteristics of input gas issues and/or damage to components of the plasma chamber 22.

In embodiments, the detection unit 61 includes: a sensor 64 that converts light into an electrical signal; a switchable bandpass filter 65 disposed in front of the sensor 64 and having one or more bandpass filters; an electrical circuit 62 for conditioning the electrical signal generated by the sensor and sending the conditioned signal to a controller 69; an electrical wire 70 for communicating electrical signals between the electrical circuit 62 and controller 69; and optionally, a lens 68 (or any other suitable optical element) for collecting light onto the sensor 64. In embodiments, an electrical circuit 62 is preferably (but not limited to) formed on a circuit board. In embodiments, the controller 69 is a computing device that controls the detection unit 61 and processes the electrical signals from the detection unit 61.

It is noted that the sensor 64 is a wideband detector and each of the one or more bandpass filters of the switchable bandpass filter 65 passes light in a predetermined wavelength range. For instance, the switchable bandpass filter 65 includes four bandpass filters that respectively pass through UVA, UVB, UVC and near/mid IR light.

In alternative embodiments, the sensor 64 includes multiple detectors that each detect light in a predetermined wavelength range, and the detection unit 61 does not include any filter. For instance, the sensor 64 includes a first detector for measuring the intensity of UVA light; a second detector for measuring the intensity of UVB light; a third detector for measuring the intensity of UVC light; and a fourth detector for measuring the intensity of IR light.

It is noted that the sensor 64 and electrical circuit 62 may be arranged in different manners. For instance, the sensor 64 is physically separated from the electrical circuit 62 and communicates electrical signals to the electrical circuit 62 via an electrical wire or a wireless channel. In another example, the electrical circuit 62 communicates electrical signals to the controller 69 via a wireless channel In embodiments the controller 69 performs processing the signals from the detection unit 61, such as averaging the intensities of UV light and/or determining the maximum and minimum intensities of light for each wavelength range to thereby determine the plasma health/stability and operations conditions of the system 10.

Figure 10:
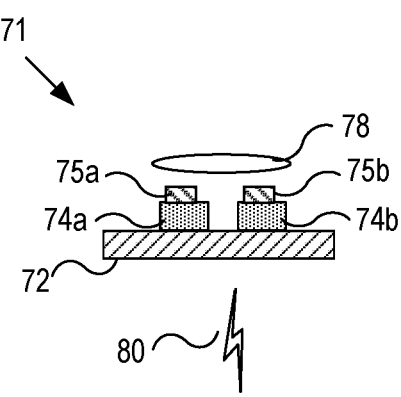
FIG. 10 shows a cross sectional view of a detection unit according to embodiments of the present disclosure.

FIG. 10 shows a cross sectional view of a detection unit 71 according to embodiments of the present disclosure. As depicted, the detection unit 71 includes: sensors 74a and 74b that each convert light into an electrical signal; optical filters 75a and 75b mounted on the sensors 74a and 74b, respectively, and configured to selectively pass light of predetermined wavelength ranges; an electrical circuit 72 for processing the electrical signal; and optionally a lens 78 for collecting light onto the optical filters 75a and 75b. In embodiments, the electrical circuit 72 communicates electrical signals to a controller 82 via wireless communication channel 80. In alternative embodiments, the detection unit 71 may include an electrical wire that is similar to the electrical wire 70.

In embodiments, the sensors 74a and 74b are broadband detectors, and each of the filters 75a and 75b is a bandpass filter that passes through light of a predetermined wavelength range. For instance, the filter 75a passes through UV light while the filter 75b is a bandpass filter that passes through IR light. It is noted that the detection unit 71 incudes any other suitable number of sensors/filters so that each sensor detects the light in a specific wavelength range. For instance, the detection unit 71 may include at least three broadband detectors and bandpass filters for detecting UVA, UVB, and UVC emissions, respectively.

In embodiments, as the plasma 46 is turned off, the UV emission is extinguished and the intensity of IR emission detected by the detection unit 61 (or 71) is diminished. As such, the presence of UV indicates the existence of plasma 46 and time-resolved character of the UV emission detected by the detection unit 61 (or 71) is descriptive of plasma health/stability. In embodiments, the amplitude of IR emission detected by the detection unit 61 (or 71) is used to detect the process-gas composition related specifications and undesirable depositions on the components of the plasma chamber 22, such as inner wall 40. For instance, the detected intensity of IR emission is used to determine abnormal conditions, such as, but not limited to, carbon depositions. In embodiments, the detection unit 61 (or 71) generates and sends an electrical signal at each predetermined interval so that the plasma status/health and operational condition of the system 10 are continuously monitored.

Figure 11:
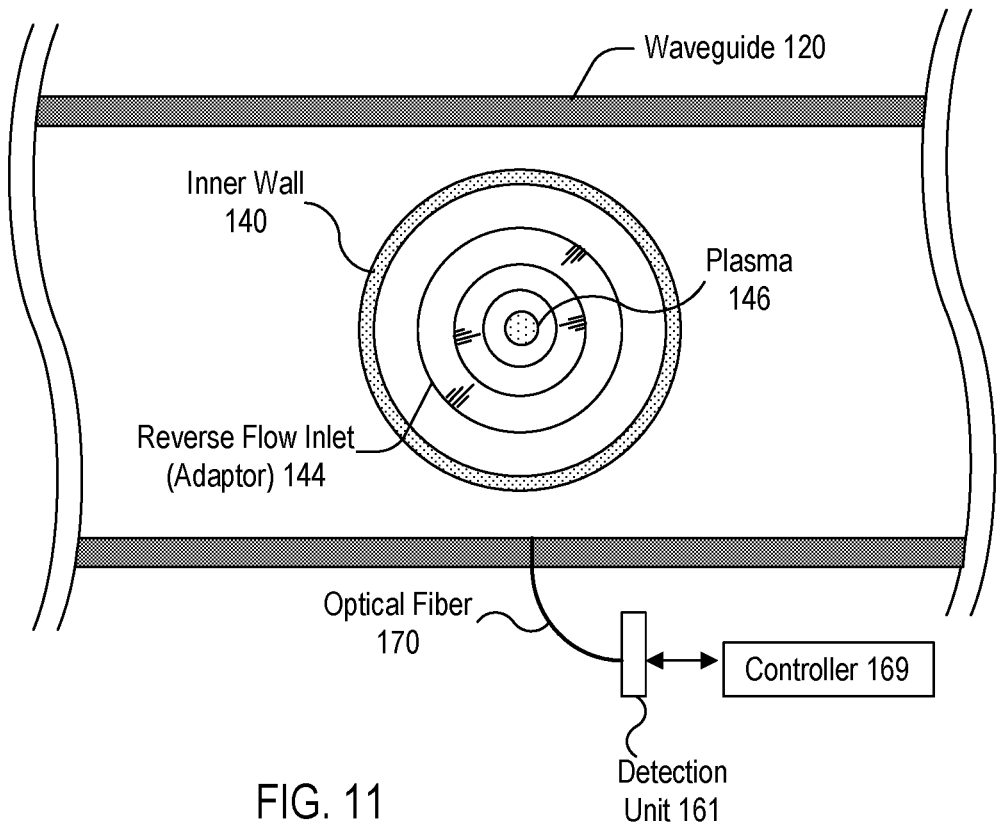
FIG. 11 shows a cross sectional view of a plasma chamber according to embodiments of the present disclosure.

In embodiments, the detection unit 61 (or 71) is disposed outside the aperture 66 to avoid intrusion into the plasma chamber 22, which significantly reduces the workload of installation and maintenance of the detection unit as well as the possibility of electromagnetic radiation leakage through the plasma chamber 22. In embodiments, the measurement of the UV and IR emissions may be performed without using the protruding cylinder 13. FIG. 11 shows a cross sectional view of a plasma chamber according to embodiments of the present disclosure. As depicted, the optical measurement system includes: at least one optical fiber 170 installed in the wall of a waveguide 120; and a detection unit 161 coupled to the optical fiber 170. In embodiments, one end of the optical fiber 170 is configured to receive the light emitted by the plasma 146 as well as the light reflected from various components of the plasma chamber, and the collected light travels through the optical fiber to the detection unit 161. In embodiments, the optical fiber 170 is formed of material that can transmit the UV and IR light therethrough.

The detection unit 161 is similar to the detection unit 61 (or 71) and communicatively coupled to a controller 169 via a wire or a wireless channel. In alternative embodiments, the detection unit 161 and controller 169 are formed in one integral body.

Figure 12:
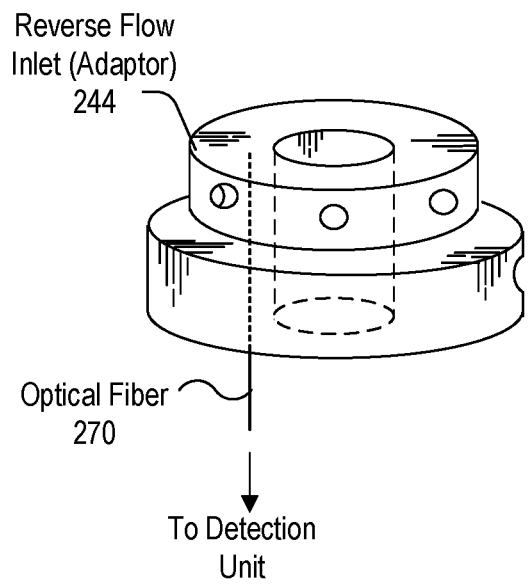
FIG. 12 shows a perspective view of an adaptor according to embodiments of the present disclosure.

It should be apparent to those of ordinary skill in the art that one or more optical fibers may be installed in other suitable locations within the plasma chamber. FIG. 12 shows a perspective view of an adaptor 244 according to embodiments of the present disclosure. As depicted, the adaptor 244 includes an optical fiber 270, where one end of the optical fiber 270 is configured to receive the UV and IR light inside the plasma chamber and the other end of the optical fiber 270 is coupled to a detection unit that is similar to the detection unit 161. Since the optical fiber 270 is installed in the adaptor 244, the light emitted by the plasma 146 does not pass through the inner wall 140 before the light reaches the optical fiber, i.e., the inner wall 140 is outside the line of sight of the optical fiber, and as such, it is not necessary that the inner wall 140 is formed of material that is transparent to the UV light.

Figure 13:
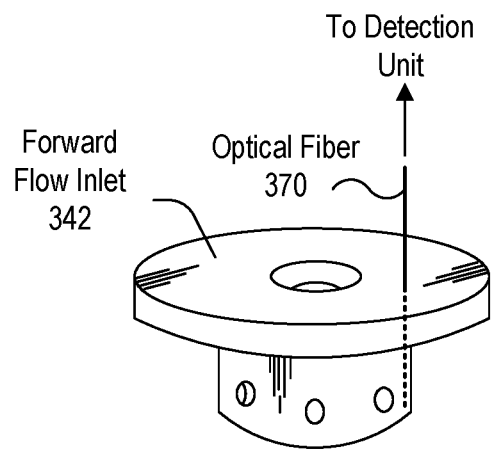
FIG. 13 shows a perspective view of a forward flow inlet according to embodiments of the present disclosure.

FIG. 13 shows a perspective view of a forward flow inlet 342 according to embodiments of the present disclosure. As depicted, the forward flow inlet 342 includes an optical fiber 370, where one end of the optical fiber 370 is configured to receive the UV and IR light inside the plasma chamber and the other end of the optical fiber 370 is coupled to a detection unit that is similar to the detection unit 161. Since the optical fiber 370 is installed in the forward flow inlet 342, the light emitted by the plasma 146 does not pass through the inner wall 140 before the light reaches the optical fiber, i.e., the inner wall 140 is outside the line of sight of the optical fiber, and as such, it is not necessary that the inner wall 140 is formed of material that is transparent to the UV light.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A plasma generating system, comprising:
   a plasma cavity for generating a plasma therewithin by use of microwave energy;
   a flow inlet being configured to introduce a gas into a center of the plasma cavity;
   a detection unit for measuring intensities of light emitted by the plasma in an ultraviolet (UV) range and an infrared (IR) range; and
   a controller for controlling the detection unit.

2. The plasma generating system as recited in claim 1, further comprising:
   a waveguide coupled to the plasma cavity; and
   a hollow cylinder protruding from a wall of the waveguide and having a bottom cap that includes an aperture,
   wherein the detection unit is arranged to receive the light through the aperture.

3. The plasma generating system as recited in claim 2, wherein the aperture is dimensioned to prevent leakage of the microwave energy therethrough while still allowing enough light through for detection.

4. The plasma generating system as recited in claim 1, wherein the detection unit includes:
   a sensor for converting light into an electrical signal; and
   a board having an electrical circuit, the sensor being mounted on the board, wherein the electrical circuit conditions the electrical signal and sends the electrical signal to the controller.

5. The plasma generating system as recited in claim 4, further comprising:
   a switchable bandpass filter disposed in front of the sensor and having one or more bandpass filters that each pass light in a wavelength range.

6. The plasma generating system as recited in claim 1, further comprising:
   a lens for collecting the light onto the detection unit.

7. The plasma generating system as recited in claim 1, wherein the detection unit includes:
   a first sensor for measuring intensity of the light in the UV range; and
   a second sensor for measuring intensity of the light in the IR range.

8. The plasma generating system as recited in claim 7, further comprising: a first bandpass filter disposed in front of the first sensor and configured to pass the light in the UV range; and
   a second bandpass filter disposed in front of the second sensor and configured to pass the light in the IR range.

9. The plasma generating system as recited in claim 1, further comprising:
   a waveguide coupled to the plasma cavity; and
   an optical fiber installed in the waveguide and having one end for receiving the light and an other end coupled to the detection unit.

10. The plasma generating system as recited in claim 1, further comprising:
    a waveguide for transmitting the microwave energy therethrough;
    an inner wall disposed within the waveguide to define the plasma cavity;
    an adaptor mounted on the waveguide and configured to introduce a gas into the plasma cavity and generate a vortex flow within the plasma cavity using the gas, the adaptor having a through hole through which a gas processed by the plasma exits the plasma cavity; and
    an optical fiber installed in the adaptor and having one end for receiving the light and an other end coupled to the detection unit.

11. The plasma generating system as recited in claim 1, further comprising:
    a waveguide for transmitting the microwave energy therethrough;
    the flow inlet being a forward flow inlet mounted on the waveguide and configured to introduce the gas into the center of the plasma cavity and to generate a vortex flow within the plasma cavity using the gas; and
    an optical fiber installed in the forward flow inlet and having one end for receiving the light and an other end coupled to the detection unit.

12. The plasma generating system as recited in claim 11, wherein the controller is configured to determine a possible input gas issue or damage to the plasma cavity based on a combination of both UV and IR emissions of varying amplitudes.

13. The plasma generating system as recited in claim 11, wherein the controller is configured to determine a possible deposition on a surface of the plasma cavity based on the measured intensity of light emitted by the plasma in the IR range.

14. The plasma generating system as recited in claim 11, wherein the detection unit is configured to detect a diminution of IR intensity and a presence of UV that is indicative of plasma stability.

15. The plasma generating system as recited in claim 1, the flow inlet being at a first end of the plasma cavity and configured to generate a vortex flow within the plasma cavity using the gas.

16. The plasma generating system as recited in claim 15, the flow inlet having a first opening, a second opening having, and a gas passageway disposed therethrough from the first opening to the second opening.

17. The plasma generating system as recited in claim 16, the gas passageway having a geometry to impart spiral a motion to the flow as the flow enters the plasma cavity via the gas passageway.

18. The plasma generating system as recited in claim 16, the gas passageway being curved to enhance the vorticity of the flow.

19. The plasma generating system as recited in claim 15, further comprising a plasma stabilizer protruding into the plasma cavity and configured to contribute to the vortex flow within the plasma cavity.

20. The plasma generating system as recited in claim 1, wherein the detection unit includes:
    a sensor to generate an electrical signal based on sensed light; and
    an electrical circuit to condition the electrical signal generated by the sensor and to send the conditioned electrical signal to the controller.

* * * * *